(12) United States Patent
Segawa

(10) Patent No.: US 6,806,178 B2
(45) Date of Patent: Oct. 19, 2004

(54) SEMICONDUCTOR DEVICE AND METHOD FOR FABRICATING THE SAME

(75) Inventor: Mizuki Segawa, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/434,062

(22) Filed: May 9, 2003

(65) Prior Publication Data
US 2003/0211716 A1 Nov. 13, 2003

Related U.S. Application Data

(62) Division of application No. 10/096,057, filed on Mar. 13, 2002, now Pat. No. 6,586,809.

(30) Foreign Application Priority Data
Mar. 15, 2001 (JP) ........................................ 2001-073398

(51) Int. Cl.[7] .............................................. H01L 21/44
(52) U.S. Cl. ........................ 438/598; 438/197; 438/206; 438/585; 438/597; 438/588; 438/592; 438/637
(58) Field of Search ................................ 438/197, 206, 438/209, 229, 230, 231, 232, 301, 585, 586, 588, 589, 592, 597, 598, 637, 669

(56) References Cited

U.S. PATENT DOCUMENTS

| | | | |
|---|---|---|---|
| 5,751,048 A | 5/1998 | Lee et al. | |
| 6,064,090 A | 5/2000 | Miyamoto et al. | |
| 6,180,501 B1 * | 1/2001 | Pey et al. | 438/592 |
| 6,207,543 B1 * | 3/2001 | Harvey et al. | 438/586 |
| 6,225,218 B1 * | 5/2001 | Yamazaki et al. | 438/660 |
| 6,261,935 B1 * | 7/2001 | See et al. | 438/592 |
| 6,261,948 B1 | 7/2001 | Dennison | |
| 6,297,109 B1 * | 10/2001 | Chan et al. | 438/300 |

FOREIGN PATENT DOCUMENTS

JP    09-275137    10/1997

* cited by examiner

Primary Examiner—Maria Guerrero
(74) Attorney, Agent, or Firm—Nixon Peabody LLP; Donald R. Studebaker

(57) ABSTRACT

A gate insulating film, a gate electrode, a gate-top protection film, LDD layers and nitride film sidewalls are formed on a semiconductor substrate. Source/drain regions are formed in the semiconductor substrate. After deposition of an interlayer insulating film on the resultant substrate, a hole is formed through the interlayer insulating film and the gate-top protection film to reach the gate electrode, and a gate contact is formed by filling the hole. The gate-top protection film has an opening exposing part of a portion of the area on the top surface of the gate electrode other than the region in contact with the gate contact. This facilitates external diffusion of hydrogen during annealing, or recovery from a fixed level and a damage layer during sintering.

18 Claims, 9 Drawing Sheets

Heat treatment

H₂ sintering

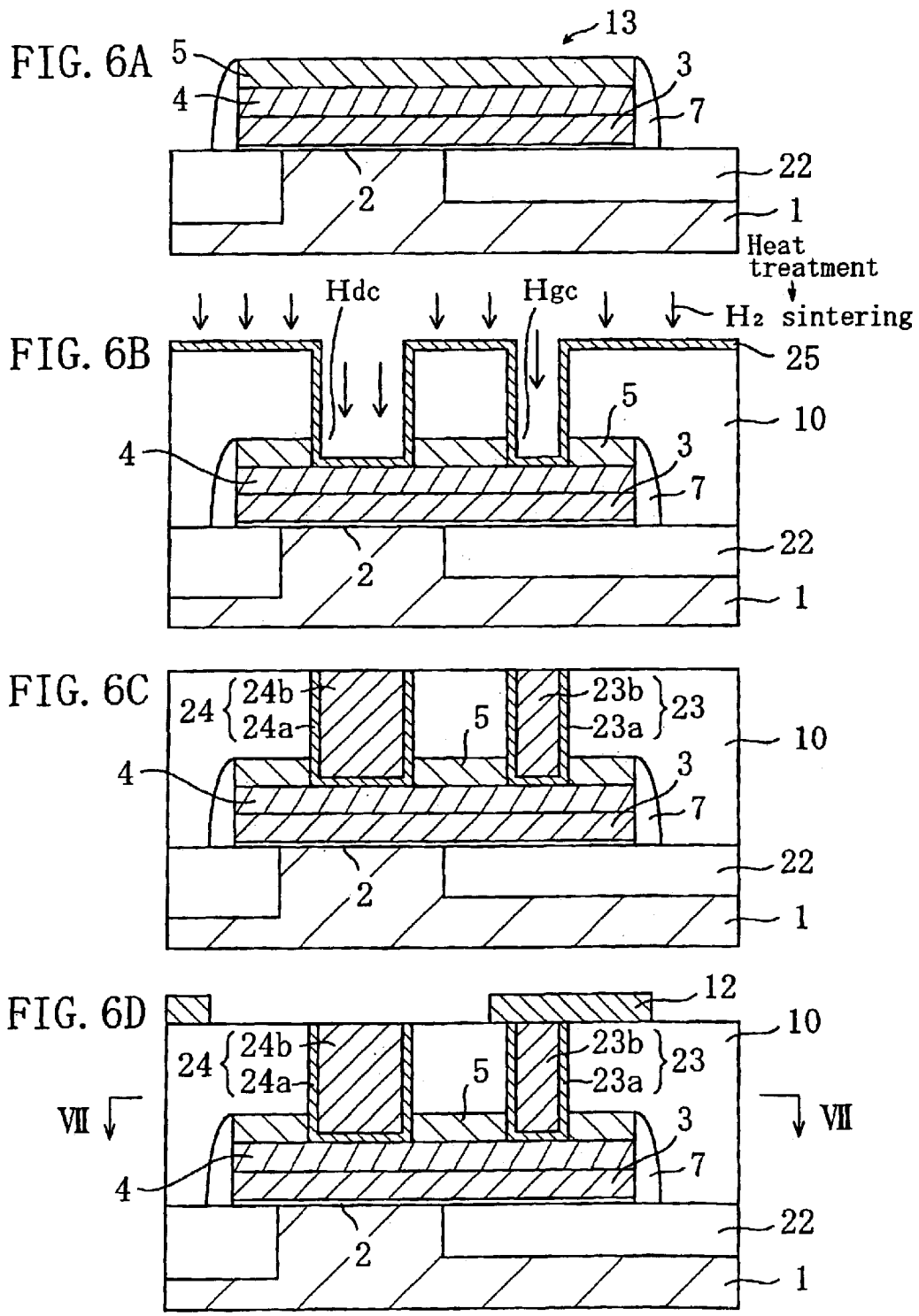

SEMICONDUCTOR DEVICE AND METHOD FOR FABRICATING THE SAME

BACKGROUND OF THE INVENTION

The present invention relates to a semiconductor device and a method for fabricating the semiconductor device, and in particular, relates to measures for improving the reliability of the semiconductor device.

In recent years, with the scaledown and operation speedup of LSIs, reduction in the sizes of individual parts of a MISFET of an LSI according to scaling rules have been requested. In particular, it has become increasingly necessary to reduce the margin between the gate electrode and the contacts to the active regions as the source/drain of the MISFET. In general, in a self-alignment contact (SAC) structure in which source/drain contacts are allowed to overlap a gate electrode and sidewalls, it is necessary to prevent short-circuiting between the contacts and the gate electrode and short-circuiting between the contacts and regions of the semiconductor substrate right under the sidewalls. For this purpose, a gate-top protection film and the sidewalls of the gate electrode are made of a silicon nitride film because the silicon nitride film has a high dry-etching selective ratio with respect to an oxide film constituting an interlayer insulating film.

FIGS. 8A to 8C are cross-sectional views showing a conventional fabrication process of a p-channel MISFET of the SAC structure having a poly-metal gate electrode. In general, an n-channel MISFET is also formed in another region although illustration of the fabrication process thereof is omitted in FIGS. 8A to 8C.

Referring to FIG. 8A, a silicon oxide-nitride film serving as a gate insulating film is formed on the principal plane of a Si substrate 101. A polysilicon film is then deposited on the silicon oxide-nitride film by LPCVD. During this deposition, the polysilicon film is also deposited on the back surface of the Si substrate as a back polysilicon film 120. Boron ions ($B^+$) as p-type impurity ions are implanted in a portion of the polysilicon film on the principal plane side located in a p-channel MISFET formation region under the conditions of an accelerating energy of 5 keV and a dose of $3 \times 10^{15}$ cm$^{-2}$. Note that in general n-type impurity ions are implanted in an n-channel MISFET formation region. A metal film having a thickness of 50 nm is then deposited by sputtering, and subsequently a silicon nitride film having a thickness of 100 nm is deposited on the metal film. During this deposition, the silicon nitride film is also deposited on the surface of the back polysilicon film 120 on the back side of the Si substrate 101, as a back silicon nitride film 121. Thereafter, the silicon nitride film, the metal film, the polysilicon film and the silicon oxide-nitride film formed on the principal plane side of the Si substrate 101 are patterned by photolithography and dry etching, to form a gate electrode portion 113 essentially composed of a gate insulating film 102, a lower gate electrode 103, an upper gate electrode 104 and a gate-top protection film 105 on the Si substrate 101.

Thereafter, a resist mask is formed covering the n-channel MISFET formation region while leaving the p-channel MISFET formation region open. In this state, boron fluoride ions ($BF_2^+$) as p-type impurity ions are implanted in the Si substrate 101 using the gate electrode portion 113 as a mask under the conditions of an accelerating energy of 10 keV and a dose of $3.0 \times 10^{14}$ cm$^{-2}$, to form p-type LDD layers 106.

Referring to FIG. 8B, after removal of the resist mask, a silicon nitride film is deposited on the resultant substrate to a thickness of 80 nm by LPCVD. The silicon nitride film is then etched back to form nitride film sidewalls 107 on the sides of the gate electrode portion 113. During this etchback, a back silicon nitride film 122 formed during the deposition of the silicon nitride film for the sidewalls remains unremoved on the back silicon nitride film 121 on the back side of the Si substrate 101. Thereafter, a resist mask is formed again covering the n-channel MISFET formation region while leaving the p-channel MISFET formation region open. In this state, boron fluoride ions ($BF_2^+$) as p-type impurity ions are implanted in the Si substrate 101 using the gate electrode portion 113 and the nitride film sidewalls 107 as a mask under the conditions of an accelerating energy of 50 keV and a dose of $5.0 \times 10^{15}$ cm$^{-2}$, to form p-type source/drain regions 108.

The impurities implanted in the LDD regions 106 and the source/drain regions 108 are then activated by rapid thermal annealing (RTA) at 1000° C. for 10 seconds.

Subsequently, a Co film having a thickness of 8 nm is deposited on the resultant substrate and subjected to thermal treatment at 500° C. for 60 seconds to allow Si to react with Co to form cobalt silicide films 109 on the source/drain regions 108. Unreacted part of the Co film is then removed by etching.

Referring to FIG. 8C, an interlayer insulating film 110 made of a BPSG film having a thickness of 800 nm is deposited on the resultant substrate and smoothed by chemical mechanical polishing (CMP). Contact holes are then formed through the interlayer insulating film 110 to reach the cobalt silicide films 109 on the source/drain regions 108 by dry etching using a resist mask. The contact holes are filled with tungsten and the like to form source/drain contacts 111. During this formation, no margin is set for alignment between the photomask used for the gate electrode patterning and the photomask used for the contact hole formation (self-alignment). Therefore, the size of the MISFET formation region can be reduced.

Thereafter, a metal film such as an aluminum alloy film is deposited on the interlayer insulating film 110 and then patterned to form metal interconnections 112 on the interlayer insulating film 110 to be connected with the source/drain contacts 111.

During the formation of interconnections, heat treatment in a hydrogen atmosphere (hydrogen sintering) is performed at 400° C. for 30 minutes, for example, for recovery from a fixed level induced at the interface between the Si substrate 101 and the gate insulating film 102 and a damage layer in the Si substrate 101.

The MIS transistor fabricated in the conventional process described above has the following problems.

In a process step shown in FIG. 8A, the lower gate electrode 103 and the back surface of the Si substrate 101 are subjected to the high-temperature heat treatment in the state that they are covered with the gate-top protection film 105 made of a nitride film and the back silicon nitride film 121. This results in that they receive intense stress from the silicon nitride films. In addition, during the formation of the silicon nitride film by LPCVD, hydrogen enters the silicon nitride film. Such hydrogen fails to be diffused to the outside by being interfered by the silicon nitride film itself and remains inside the gate electrode. With the existence of hydrogen in the gate electrode and also the existence of the stress as described above, intrusion of boron in the gate electrode into the gate insulating film 102 and the Si substrate 101 is facilitated during the activation of the impurities implanted in the source/drain regions 108 and the like. As a result, the flat band voltage of the MIS capacitor may decrease, and this may possibly increases the variation in the threshold voltage of the transistor.

The lower gate electrode 103 and the back surface of the Si substrate 101 are covered with the gate-top protection film 105 made of a nitride film and the back silicon nitride film 121 as described above. This causes another problem of insufficient supply of hydrogen to the gate insulating film 102 and the Si substrate 101 during the hydrogen sintering. As a result, recovery from a fixed level induced at the interface between the Si substrate 101 and the gate insulating film 102 and a damage layer in the Si substrate 101 is insufficient. This may possibly deteriorate the reliability of the semiconductor device, including decrease in hot carrier resistance during actual use of the semiconductor device.

FIG. 9 is a graph showing the gate area dependency of the flat band voltage of a pMIS capacitor. As is found from FIG. 9, the larger the gate area is, the smaller the flat band voltage is. The reason is as follows. The lower gate electrode 103 receives more intense stress from the silicon nitride film as the gate area is larger. Therefore, boron is more easily diffused from the gate electrode into the gate insulating film 102 and the Si substrate 101. As the flat band voltage decreases, the threshold voltage varies among transistors of different sizes. This causes a significantly serious problem for logic circuits.

SUMMARY OF THE INVENTION

An object of the present invention is providing a semiconductor device including a MISFET of the SAC structure exhibiting high integrity while maintaining high reliability, and a method for fabricating such a semiconductor device.

The semiconductor device of the present invention includes: a semiconductor substrate; a gate insulating film formed on the semiconductor substrate; a gate electrode made of a conductive material formed on the gate insulating film; a gate-top protection film made of an insulating material formed on the gate electrode; source/drain regions formed by implanting impurities in regions of the semiconductor substrate located on both sides of the gate electrode; an interlayer insulating film formed on the resultant substrate; and a gate contact member formed by filling a gate contact hole with a conductive material, the gate contact hole extending through the interlayer insulating film and the gate-top protection film to reach the gate electrode, wherein the gate-top protection film has an opening exposing part of a portion of an area located on the top surface of the gate electrode other than the region of the gate contact hole.

With the above structure, since the gate-top protection film does not cover the entire gate electrode, diffusion of hydrogen in the gate electrode to the outside is facilitated and also stress applied to the gate electrode is relieved. Therefore, intrusion of impurities such as boron in the gate electrode into the gate insulating film and the semiconductor substrate can be suppressed, and thus a highly reliable semiconductor device with a reduced variation in threshold voltage is obtained. In addition, with this structure, hydrogen can be easily supplied to the gate insulating film and the semiconductor substrate via the region of the gate electrode that is not covered with the gate-top protection film during hydrogen sintering in the fabrication process. This facilitates recovery from a fixed level and damage, and thus provides a structure exhibiting high hot carrier resistance during actual use of the semiconductor device.

The gate-top protection film is preferably a silicon nitride film. This provides a structure suitable for enhancing the density of the semiconductor device by adopting the SAC structure.

The semiconductor device may further includes source/drain contact members formed by filling holes with a conductive material, the holes extending through the interlayer insulating film to reach the source/drain regions, wherein the gate-top protection film is left behind only on portions of the area on the top surface of the gate electrode determined considering overlap with the source/drain contact members. Therefore, since the SAC process is possible using the remaining portions of the gate-top protection film, this structure is suitable for attaining a finer device. That is, it is possible to provide a semiconductor device having a structure suitable for size reduction while maintaining high reliability.

Preferably, the opening of the gate-top protection film is part of a dummy contact hole extending through the interlayer insulating film and the gate-top protection film to reach the gate electrode, and the device further comprises a dummy contact member formed by filling the dummy contact hole with a conductive member, the dummy contact member not being used for supply of a voltage to the gate electrode. With the dummy contact member, part of the top surface of the gate electrode is open. Therefore, by performing annealing and hydrogen sintering under the existence of this contact, it is possible to provide a semiconductor device having a structure suitable for facilitated diffusion of hydrogen in the gate electrode to the outside and recovery from a fixed level and damage.

The dummy contact member is preferably larger in cross-sectional area than the gate contact member.

The first method for fabricating a semiconductor device of the present invention includes the steps of: (a) forming a gate insulating film on a semiconductor substrate; (b) depositing a conductive film on the gate insulating film; (c) forming a silicon nitride film covering both surfaces of the semiconductor substrate after the step (b); (d) patterning the conductive film and a portion of the silicon nitride film located on the principal plane side of the semiconductor substrate to form a gate electrode and a gate-top protection film; (e) implanting impurity ions in the semiconductor substrate to form source/drain regions after the step (d); (f) performing annealing for activation of the impurities implanted in the source/drain regions; and (g) removing a portion of the silicon nitride film located on the back side of the semiconductor substrate after the step (c) and before the step (f).

By the above method, in the step of performing annealing for activation of the impurities, application of stress to the gate electrode and the semiconductor substrate is suppressed because the silicon nitride film on the back side of the substrate has been removed. As a result, diffusion of impurities such as boron in the gate electrode can be suppressed, and thus it is possible to fabricate a highly reliable semiconductor device with a reduced variation in threshold voltage.

The method may further include the step of performing hydrogen sintering after the step (f). By the hydrogen sintering, hydrogen can be efficiently supplied to the gate insulating film and the region near the principal plane of the semiconductor substrate via the back surface of the semiconductor substrate. Therefore, it is possible to fabricate a semiconductor device in which recovery from a fixed level and damage is facilitated and high hot carrier resistance is exhibited during actual use of the semiconductor device.

The second method for fabricating a semiconductor device of the present invention includes the steps of: (a) forming a gate insulating film on a semiconductor substrate; (b) depositing a conductive film on the gate insulating film;

(c) forming a silicon nitride film covering the principal plane of the semiconductor substrate after the step (b); (d) patterning the silicon nitride film to form a gate-top protection film only on part of an area located immediately above a gate electrode of the conductive film; (e) patterning the conductive film to form the gate electrode; (f) implanting impurity ions in the semiconductor substrate to form source/drain regions after the step (e); (g) performing annealing for activation of the impurities implanted in the source/drain regions; (h) forming an interlayer insulating film on the resultant substrate; and (i) forming contact holes through the interlayer insulating film to reach the source/drain regions, the contact holes overlapping the gate electrode only via the gate-top protection film at any overlap portion with the gate electrode.

By the above method, since the gate-top protection film does not cover the entire gate electrode during the annealing in the step (g), diffusion of hydrogen in the gate electrode to the outside is facilitated, and also stress applied to the gate electrode during the heat treatment is relieved. Therefore, intrusion of impurities in the gate electrode into the gate insulating film and the semiconductor substrate can be suppressed, and thus reduction in flat band voltage due to the intrusion of impurities is suppressed. It is therefore possible to fabricate a semiconductor device with a reduced variation in threshold voltage.

The method may further include the step of performing hydrogen sintering after the step (g) and before the step (h). During this hydrogen sintering, hydrogen can easily enter the gate insulating film and the semiconductor substrate via the region of the gate electrode that is not covered with the gate-top protection film. This facilitates recovery from a fixed level and damage, and thus high hot carrier resistance is exhibited during actual use of the semiconductor device. Moreover, the SAC process is possible using the locally formed gate-top protection film on the gate electrode. Thus, it is possible to fabricate a fine semiconductor device while maintaining high reliability.

The third method for fabricating a semiconductor device of the present invention includes the steps of: (a) forming a gate insulating film on a semiconductor substrate; (b) depositing a conductive film on the gate insulating film; (c) forming a silicon nitride film covering the principal plane of the semiconductor substrate after the step (b); (d) patterning the silicon nitride film and the conductive film to form a gate-top protection film and a gate electrode; (e) implanting impurity ions in the semiconductor substrate to form source/drain regions after the step (d); (f) forming an interlayer insulating film on the resultant substrate after the step (e); (g) forming a contact hole through the interlayer insulating film and the gate-top protection film to reach the gate electrode; and (h) performing heat treatment for activation of the impurities implanted in the source/drain regions after the step (g).

By the above method, since the gate-top protection film does not cover the entire gate electrode during the annealing, diffusion of hydrogen in the gate electrode to the outside is facilitated, and also stress applied to the gate electrode during the heat treatment is relieved. Therefore, intrusion of impurities in the gate electrode into the gate insulating film and the semiconductor substrate can be suppressed, and thus reduction in flat band voltage due to the intrusion of impurities is suppressed. It is therefore possible to fabricate a semiconductor device with a reduced variation in threshold voltage.

The method may further include the step of performing hydrogen sintering after the step (g). During this hydrogen sintering, hydrogen can easily enter the gate insulating film and the semiconductor substrate via the region of the gate electrode that is not covered with the gate-top protection film. This facilitates recovery from a fixed level and damage, and thus high hot carrier resistance is exhibited during actual use of the semiconductor device. Moreover, the SAC process is possible using the locally formed gate-top protection film on the gate electrode. Thus, it is possible to fabricate a fine semiconductor device while maintaining high reliability.

The method may further include the step of forming a barrier metal film over the contact hole and the interlayer insulating film. In this case, the step (h) is preferably performed after the step of forming a barrier metal film. More preferably, the method further includes the step of performing hydrogen sintering after the step of forming a barrier metal film.

The method may further include the step of forming a contact member by filling the contact hole with a conductive material. In this case, the step (h) may be performed after the step of forming a contact member.

In the above case, also, the method preferably further includes the step of performing hydrogen sintering after the step of forming a contact member.

In the step (g), preferably, at least a gate contact hole and a dummy contact hole are formed as the contact hole, the gate contact hole is a hole to be filled with a contact member used for supply of a voltage to the gate electrode, and the dummy contact hole is a hole to be filled with a dummy contact member that is not used for supply of a voltage to the gate electrode.

BRIEF DESCRIPTION OF THE DRAWINGS

FIGS. 6A to 6D are cross-sectional views showing a fabrication process of a p-channel MISFET of the SAC structure in Embodiment 5 of the present invention.

DESCRIPTION OF THE PREFERRED EMBODIMENTS

Hereinafter, preferred embodiments of the present invention will be described with reference to the accompanying drawings.

Embodiment 1

FIGS. 1A to 1D are cross-sectional views showing a fabrication process of a p-channel MISFET of the SAC structure in Embodiment 1 of the present invention. In general, an n-channel MISFET is also formed in another region although illustration of the fabrication process thereof is omitted in FIGS. 1A to 1D.

Figure 1A:
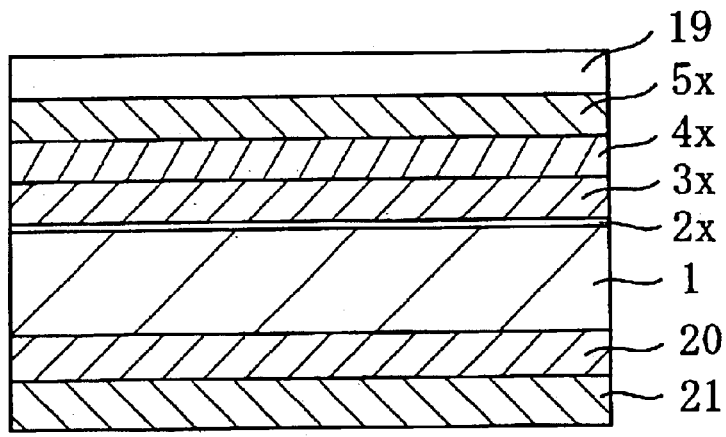
FIGS. 1A to 1D are cross-sectional views showing a fabrication process of a p-channel MISFET of the SAC structure in Embodiment 1 of the present invention.

Referring to FIG. 1A, first, a silicon oxide-nitride film 2x serving as a gate insulating film is formed on the principal plane of a Si substrate 1. A polysilicon film 3x is then deposited on the silicon oxide-nitride film 2x by LPCVD. During this deposition, the polysilicon film is also deposited on the back surface of the Si substrate 1 as a back polysilicon film 20. Boron ions ($B^+$) as p-type impurity ions are implanted in a portion of the polysilicon film 3x on the principal plane side of the Si substrate 1 located in a p-channel MISFET formation region under the conditions of an accelerating energy of 5 keV and a dose of $3 \times 10^{15}$ cm$^{-2}$. Note that in general n-type impurity ions are implanted in an n-channel MISFET formation region. A metal film 4x having a thickness of 50 nm is then deposited by sputtering, and subsequently a silicon nitride film 5x having a thickness of 100 nm is deposited on the metal film 4x. During this deposition, the silicon nitride film is also deposited on the surface of the back polysilicon film 20 on the back side of the Si substrate 1, as a back silicon nitride film 21. Thereafter, a silicon oxide film 19 is selectively formed on the silicon nitride film 5x by plasma CVD.

Figure 1B:
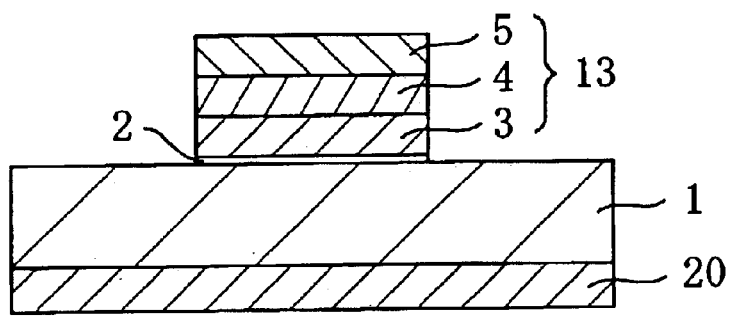

Referring to FIG. 1B, the back silicon nitride film 21 on the back side of the Si substrate 1 is removed by wet etching with a buffered hydrofluoric acid solution using the silicon oxide film 19 as a mask. Thereafter, after removal of the silicon oxide film 19 by selective etching, the silicon nitride film 5x, the metal film 4x, the polysilicon film 3x and the silicon oxide-nitride film 2x formed on the principal plane side of the Si substrate 1 are patterned by photolithography and dry etching, to form a gate electrode portion 13 essentially composed of a gate insulating film 2, a lower gate electrode 3, an upper gate electrode 4 and a gate-top protection film 5 layered on the Si substrate 1. Note that hereinafter the mere expression "gate electrode" used in this embodiment and in the subsequent embodiments refers to the combination of the upper gate electrode 4 and the lower gate electrode 3.

Figure 1C:
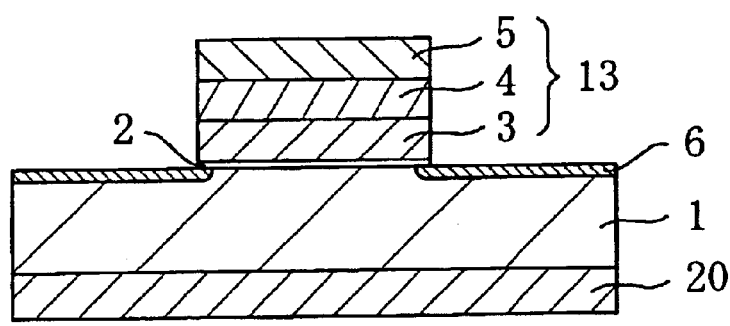

Referring to FIG. 1C, a resist mask is formed covering the n-channel MISFET formation region while leaving the p-channel MISFET formation region open. In this state, boron fluoride ions ($BF_2^+$) as p-type impurity ions are implanted in the Si substrate 1 using the gate electrode portion 13 as a mask under the conditions of an accelerating energy of 10 keV and a dose of $3.0 \times 10^{14}$ cm$^{-2}$, to form p-type LDD layers 6.

Figure 1D:
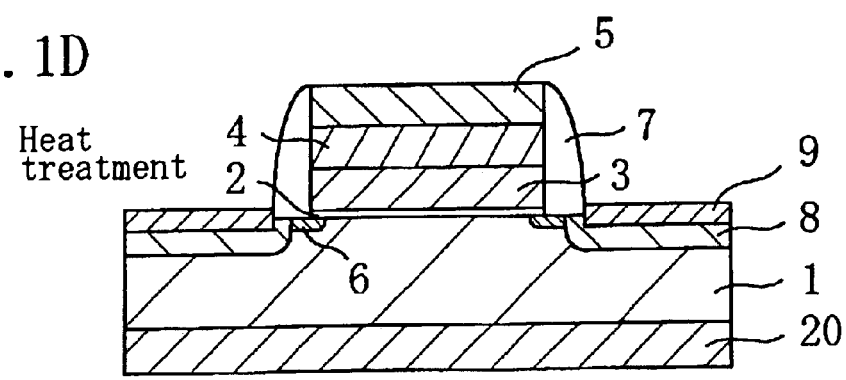

Referring to FIG. 1D, after removal of the resist mask, a silicon nitride film is deposited on the resultant substrate to a thickness of 80 nm by LPCVD. A silicon oxide film is then selectively formed only on the portion of the silicon nitride film located on the principal plane side of the Si substrate 1 by plasma CVD. Using the silicon oxide film as a mask, the other portion of the silicon nitride film formed on the back side of the Si substrate 1 is removed by wet etching with a buffered hydrofluoric acid solution. The silicon oxide film is then removed by selective etching.

The silicon nitride film is then etched back to form nitride film sidewalls 7 on the sides of the gate electrode portion 13. Thereafter, a resist mask is formed covering the n-channel MISFET formation region while leaving the p-channel MISFET formation region open. In this state, boron fluoride ions ($BF_2^+$) as p-type impurity ions are implanted in the Si substrate 1 using the gate electrode portion 13 and the nitride film sidewalls 7 as a mask under the conditions of an accelerating energy of 50 keV and a dose of $5.0 \times 10^{15}$ cm$^{-2}$, to form p-type source/drain regions 8.

The impurities implanted in the LDD regions 6 and the source/drain regions 8 are then activated by rapid thermal annealing (RTA) at 1000° C. for 10 seconds. Subsequently, a Co film having a thickness of 8 nm is deposited on the resultant substrate and subjected to thermal treatment at 500° C. for 60 seconds to allow Si to react with Co to form cobalt silicide films 9 on the source/drain regions 8. Unreacted part of the Co film is then removed by etching.

In this embodiment, no nitride film is left on the back side of the Si substrate 1. Therefore, during the RTA for activation of the impurities in the process step shown in FIG. 1D, stress applied to the Si substrate 1 can be relieved.

Figure 8A:
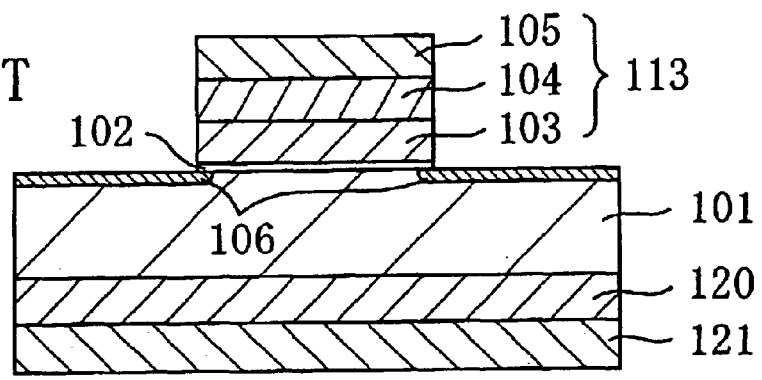
FIGS. 8A to 8C are cross-sectional views showing a conventional fabrication process of a p-channel MISFET of the SAC structure having a poly-metal gate.
Figure 8B:
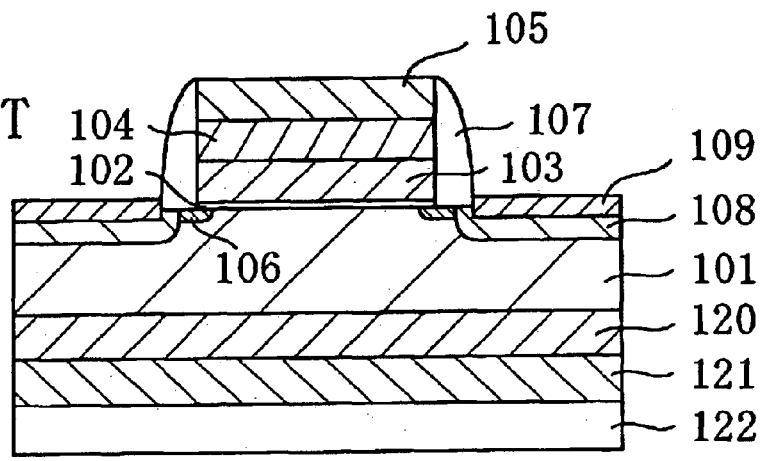
Figure 8C:
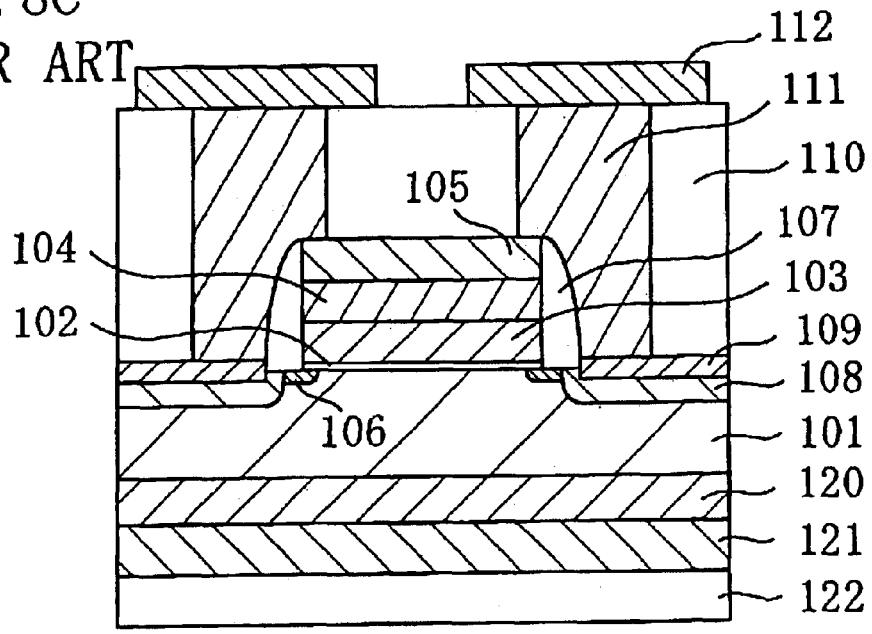
Figure 9:
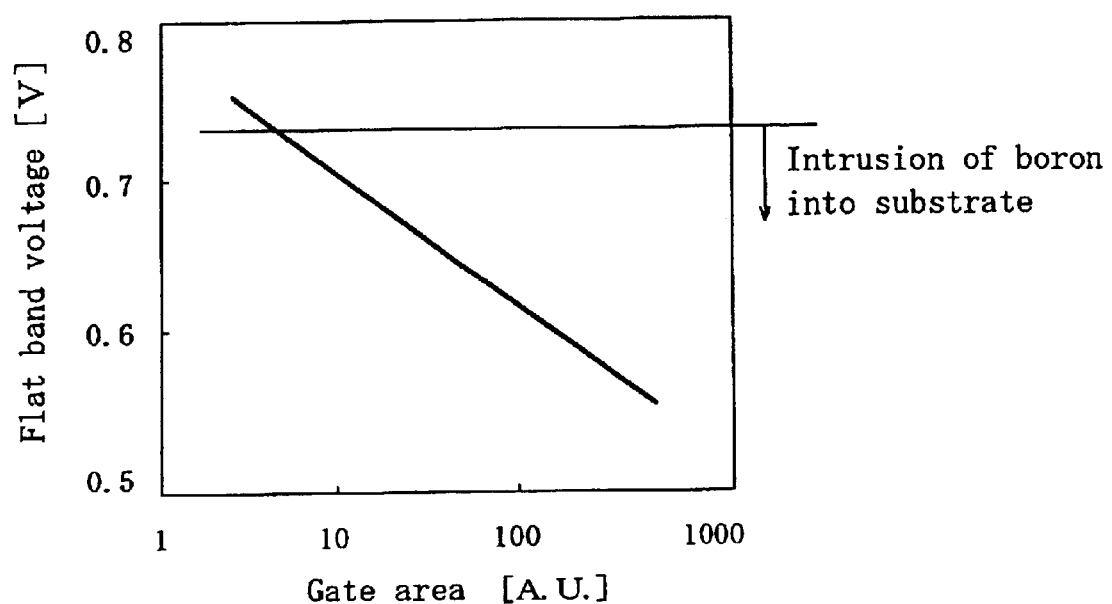
FIG. 9 is a graph showing the gate area dependency of the flat band voltage of a pMIS capacitor.

Subsequently, although illustration is omitted, process steps such as deposition of an interlayer insulating film, formation of self-alignment contact holes, formation of a gate contact and source/drain contacts, and formation of interconnections are performed as described before with reference to FIG. 8C in the conventional fabrication process. During the formation of interconnections, heat treatment in a hydrogen atmosphere (hydrogen sintering) is performed at 400° C. for 30 minutes, for example, for recovery from a fixed level induced at the interface between the Si substrate 1 and the gate insulating film 2 and damage in the Si substrate 1.

In Embodiment 1, in the process steps shown in FIGS. 1B and 1C, a level is induced at the interface between the Si substrate 1 and the gate insulating film 2 and a damage layer is formed in the Si substrate 1. But, thereafter, heat treatment in a hydrogen atmosphere (hydrogen sintering) is performed at 400° C. for 30 minutes, for example, for recovery from the level and the damage layer. Therefore, stress applied to the Si substrate 1 at the subsequent annealing and hydrogen sintering can be relieved. This makes it possible to effectively suppress diffusion of boron in the lower gate electrode 3 into the gate insulating film 2 and the Si substrate 1, and thus reduce the variation in threshold voltage due to decrease in flat band voltage. In this way, the reliability can be improved.

Embodiment 2

FIGS. 2A to 2D are cross-sectional views showing a fabrication process of a p-channel MISFET of the SAC structure in Embodiment 2 of the present invention. In general, an n-channel MISFET is also formed in another region although illustration of the fabrication process thereof is omitted in FIGS. 2A to 2D.

Figure 2A:
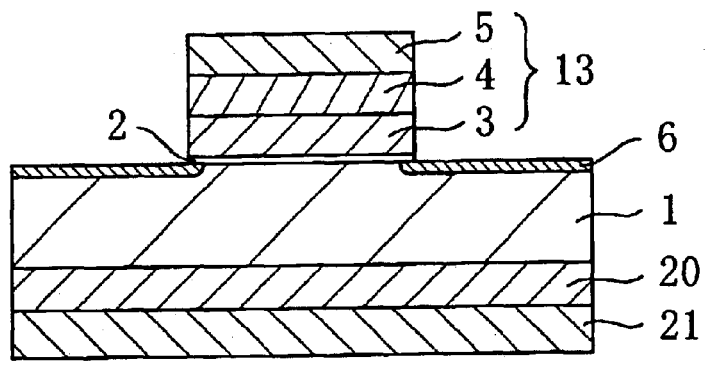
FIGS. 2A to 2D are cross-sectional views showing a fabrication process of a p-channel MISFET of the SAC structure in Embodiment 2 of the present invention.

Referring to FIG. 2A, first, a silicon oxide-nitride film serving as a gate insulating film is formed on the principal plane of a Si substrate 1. A polysilicon film is then deposited on the silicon oxide-nitride film by LPCVD. During this deposition, the polysilicon film is also deposited on the back surface of the Si substrate 1 as a back polysilicon film 20. Boron ions ($B^+$) as p-type impurity ions are implanted in a portion of the polysilicon film on the principal plane side of the Si substrate 1 located in a p-channel MISFET formation region under the conditions of an accelerating energy of 5 keV and a dose of $3 \times 10^{15}$ cm$^{-2}$. Note that in general n-type impurity ions are implanted in an n-channel MISFET formation region. A metal film having a thickness of 50 nm is then deposited by sputtering, and subsequently a silicon nitride film having a thickness of 100 nm is deposited on the metal film. During this deposition, the silicon nitride film is also deposited on the surface of the back polysilicon film 20 on the back side of the Si substrate 1, as a back silicon nitride film 21. Thereafter, the silicon nitride film, the metal film, the polysilicon film and the silicon oxide-nitride film formed on the principal plane side of the Si substrate 1 are patterned by photolithography and dry etching, to form a gate electrode portion 13 essentially composed of a gate insulating film 2, a lower gate electrode 3, an upper gate electrode 4 and a gate-top protection film 5 layered on the Si substrate 1.

Thereafter, a resist mask is formed covering the n-channel MISFET formation region while leaving the p-channel MISFET formation region open. In this state, boron fluoride ions ($BF_2^+$) as p-type impurity ions are implanted in the Si substrate 1 using the gate electrode portion 13 as a mask under the conditions of an accelerating energy of 10 keV and a dose of $3.0\times10^{14}$ $cm^{-2}$, to form p-type LDD layers 6.

Figure 2B:
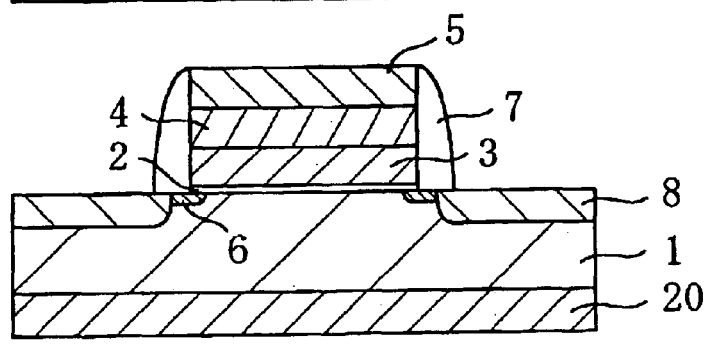

Referring to FIG. 2B, after removal of the resist mask, a silicon nitride film is deposited on the resultant substrate to a thickness of 80 nm by LPCVD. A silicon oxide film is then selectively formed only on the portion of the silicon nitride film located on the principal plane side of the Si substrate 1 by plasma CVD. Using the silicon oxide film as a mask, the back silicon nitride film formed on the back side of the Si substrate 1 is removed by wet etching with a buffered hydrofluoric acid solution. The silicon oxide film is then removed by selective etching. In this embodiment, during this process step, both the back silicon nitride film 21 formed on the back side of the substrate at the formation of the silicon nitride film for the gate-top protection film 5 and the back silicon nitride film formed on the back side of the substrate at the formation of the silicon nitride film for sidewalls are removed.

The silicon nitride film is then etched back to form nitride film sidewalls 7 on the sides of the gate electrode portion 13. Thereafter, a resist mask is formed covering the n-channel MISFET formation region while leaving the p-channel MISFET formation region open. In this state, boron fluoride ions ($BF_2^+$) as p-type impurity ions are implanted in the Si substrate 1 using the lower gate electrode 3 and the nitride film sidewalls 7 as a mask under the conditions of an accelerating energy of 50 keV and a dose of $5.0\times10^{15}$ $cm^{-2}$, to form p-type source/drain regions 8.

Figure 2C:
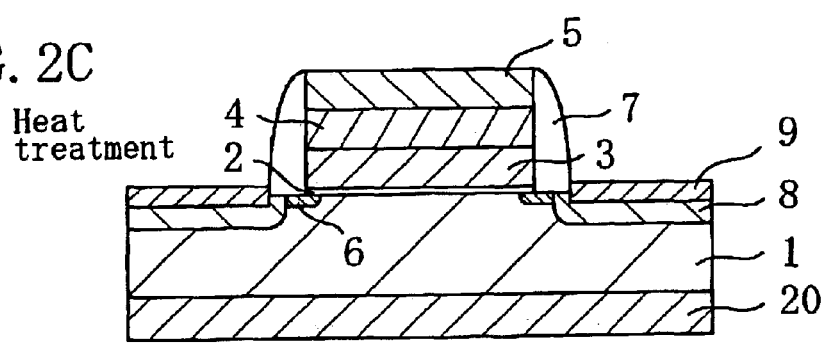

Referring to FIG. 2C, the impurities implanted in the LDD regions 6 and the source/drain regions 8 are activated by rapid thermal annealing (RTA) at 1000° C. for 10 seconds. Subsequently, a Co film having a thickness of 8 nm is deposited on the resultant substrate and subjected to thermal treatment at 500° C. for 60 seconds to allow Si to react with Co to form cobalt silicide films 9 on the source/drain regions 8. Unreacted part of the Co film is then removed by etching.

In this embodiment, no nitride film is left on the back side of the Si substrate 1. Therefore, during the RTA for activation of the impurities in the process step shown in FIG. 2C, stress applied to the Si substrate 1 can be relieved.

Figure 2D:
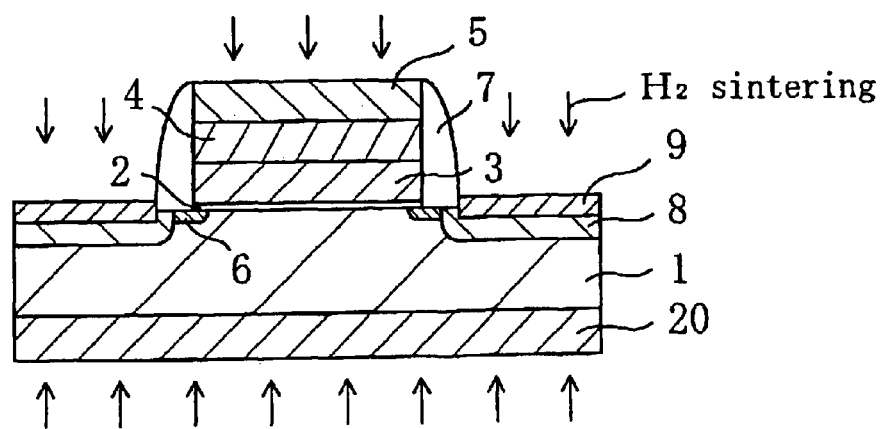

Referring to FIG. 2D, heat treatment in a hydrogen atmosphere (hydrogen sintering) is performed at 400° C. for 30 minutes, for example, for recovery from a level induced at the interface between the Si substrate 1 and the gate insulating film 2 and a damage layer in the Si substrate 1.

Subsequently, although illustration is omitted, process steps such as deposition of an interlayer insulating film, formation of self-alignment contact holes, formation of a gate contact and source/drain contacts, and formation of interconnections are performed as described before with reference to FIG. 8C in the conventional fabrication process. During the formation of interconnections, heat treatment in a hydrogen atmosphere (hydrogen sintering) is performed at 400° C. for 30 minutes, for example, for recovery from a fixed level induced at the interface between the Si substrate 1 and the gate insulating film 2 and a damage layer in the Si substrate 1.

In Embodiment 2, In the process step shown in FIG. 2B, both the back silicon nitride film 21 formed on the back side of the substrate at the formation of the silicon nitride film for the gate-top protection film 5 and the back silicon nitride film formed on the back side of the substrate at the formation of the silicon nitride film for the sidewalls are removed. Therefore, stress applied to the Si substrate 1 at the subsequent annealing can be relieved. As a result, as in Embodiment 1, it is possible to reduce the variation in threshold voltage due to decrease in flat band voltage.

In addition, in this embodiment, the hydrogen sintering is performed in the process step shown in FIG. 2D after the silicon nitride film on the back side of the Si substrate 1 has been removed. Therefore, hydrogen can be efficiently introduced into the Si substrate 1 and the gate insulating film 2 via the back-surface of the Si substrate 1. With this efficient supply of hydrogen, recovery from a fixed level near the interface between the Si substrate 1 and the gate insulating film 2 and damage in the Si substrate 1 can be effectively performed. Thus, the reliability can be improved.

In this embodiment, in the process step shown in FIG. 2B, the back silicon nitride film 21 formed on the back side of the substrate at the formation of the silicon nitride film for the gate-top protection film 5 and the back silicon nitride film formed on the back side of the substrate at the formation of the silicon nitride film for the sidewalls were removed sequentially in one step. Alternatively, these back silicon nitride films may be removed in separate steps as in Embodiment 1.

Embodiment 3

Figure 3A:
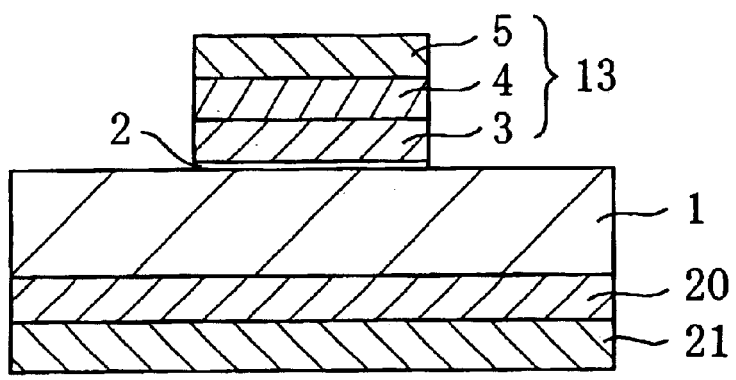
FIGS. 3A to 3C are cross-sectional views showing a fabrication process of a p-channel MISFET of the SAC structure in Embodiment 3 of the present invention.
Figure 3B:
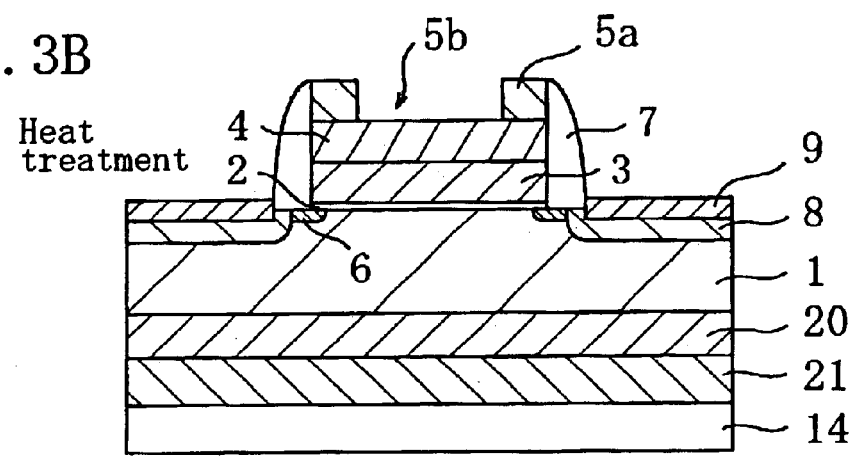
Figure 3C:
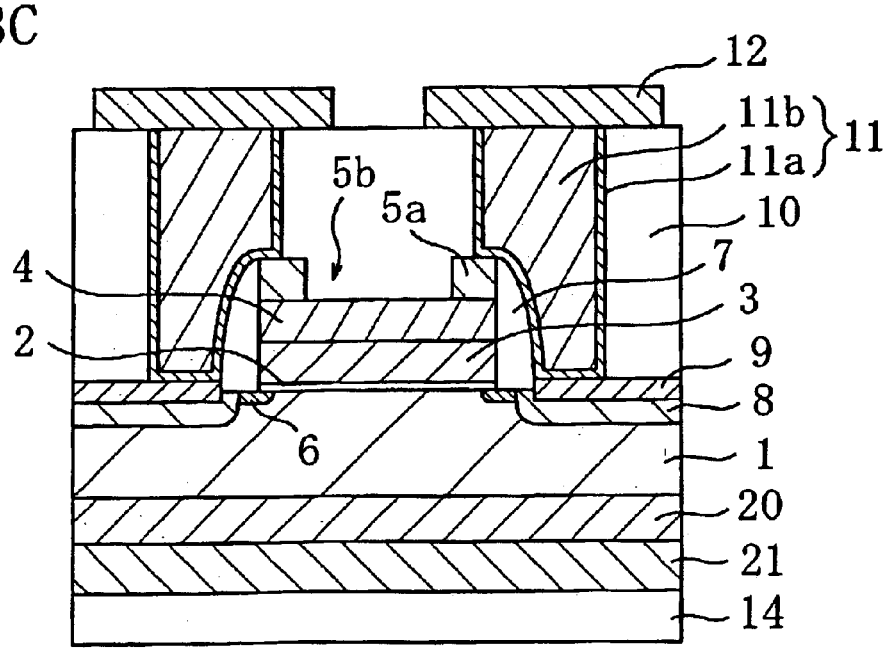

FIGS. 3A to 3C are cross-sectional views showing a fabrication process of a p-channel MISFET of the SAC structure in Embodiment 3 of the present invention. In general, an n-channel MISFET is also formed in another region although illustration of the fabrication process thereof is omitted in FIGS. 3A to 3C.

Referring to FIG. 3A, first, a silicon oxide-nitride film serving as a gate insulating film is formed on the principal plane of a Si substrate 1. A polysilicon film is then deposited on the silicon oxide-nitride film by LPCVD. During this deposition, the polysilicon film is also deposited on the back surface of the Si substrate 1 as a back polysilicon film 20. Boron ions ($B^+$) as p-type impurity ions are implanted in a portion of the polysilicon film on the principal plane side of the Si substrate 1 located in a p-channel MISFET formation region under the conditions of an accelerating energy of 5 keV and a dose of $3\times10^{15}$ $cm^{-2}$. Note that in general n-type impurity ions are implanted in an n-channel MISFET formation region. A metal film having a thickness of 50 nm is then deposited by sputtering, and subsequently a silicon nitride film having a thickness of 100 nm is deposited on the metal film. During this deposition, the silicon nitride film is also deposited on the surface of the back polysilicon film 20 on the back side of the Si substrate 1, as a back silicon nitride film 21. Thereafter, the silicon nitride film, the metal film, the polysilicon film and the silicon oxide-nitride film formed on the principal plane side of the Si substrate 1 are patterned by photolithography and dry etching, to form a gate electrode portion 13 essentially composed of a gate insulating film 2, a lower gate electrode 3, an upper gate electrode 4 and a gate-top protection film 5 layered on the Si substrate 1.

Referring to FIG. 3B, a resist mask is formed covering the n-channel MISFET formation region while leaving the p-channel MISFET formation region open. In this state, boron fluoride ions ($BF_2^+$) as p-type impurity ions are implanted in the Si substrate 1 using the gate electrode portion 13 as a mask under the conditions of an accelerating energy of 10 keV and a dose of $3.0 \times 10^{14}$ cm$^{-2}$, to form p-type LDD layers 6. After removal of the resist mask, a silicon nitride film is deposited on the resultant substrate to a thickness of 80 nm by LPCVD. The silicon nitride film is then etched back to form nitride film sidewalls 7 on the sides of the gate electrode portion 13. During this etch-back, a back silicon nitride film 14 formed during the deposition of the silicon nitride film for the sidewalls remains unremoved on the back silicon nitride film 21 on the back side of the Si substrate 1. Thereafter, a resist mask is formed covering the n-channel MISFET formation region while leaving the p-channel MISFET formation region open. In this state, boron fluoride ions ($BF_2^+$) as p-type impurity ions are implanted in the Si substrate 1 using the gate electrode portion 13 and the nitride film sidewalls 7 as a mask under the conditions of an accelerating energy of 50 keV and a dose of $5.0 \times 10^{15}$ cm$^{-2}$, to form p-type source/drain regions 8.

Thereafter, in the fabrication method of this embodiment, the gate-top protection film 5 is patterned by photolithography and dry-etching leaving only portions 5a behind at positions presumed to overlap source/drain contacts to be formed at a later stage. In other words, an opening 5b is formed through the gate-top protection film 5 shown in FIG. 3A with only the portions 5a remaining unremoved.

The impurities implanted in the LDD regions 6 and the source/drain regions 8 are then activated by rapid thermal annealing (RTA) at 1000° C. for 10 seconds. Subsequently, a Co film having a thickness of 8 nm is deposited on the resultant substrate and subjected to thermal treatment at 500° C. for 60 seconds to allow Si to react with Co to form cobalt silicide films 9 on the source/drain regions 8. Unreacted part of the Co film is then removed by etching.

Referring to FIG. 3C, an interlayer insulating film 10 made of a BPSG film having a thickness of 800 nm is deposited on the resultant substrate and smoothed by CMP. Source/drain contact holes and a gate contact hole are then formed through the interlayer insulating film 10, to reach the cobalt silicide films 9 on the source/drain regions 8 and the upper gate electrode 4, respectively, by dry etching using a resist mask. The contact holes are then filled with a Ti/TiN barrier metal film, a tungsten film and the like, to form source/drain contacts 11 each composed of a barrier layer 11a and a plug 11b and a gate contact 23 composed of a barrier layer 23a and a plug 23b (see FIGS. 4A and 4B). During this formation, no margin is set for alignment between the photomask used for the gate electrode patterning and the photomask used for the contact hole formation (self-alignment contact (SAC)) as will be discussed later. Therefore, reduction in the size of the MISFET formation region is possible.

Thereafter, a metal film such as an aluminum alloy film is deposited on the interlayer insulating film 10 and then patterned to form metal interconnections 12 on the interlayer insulating film 10 to be connected with the source/drain contacts 11.

Figure 4A:
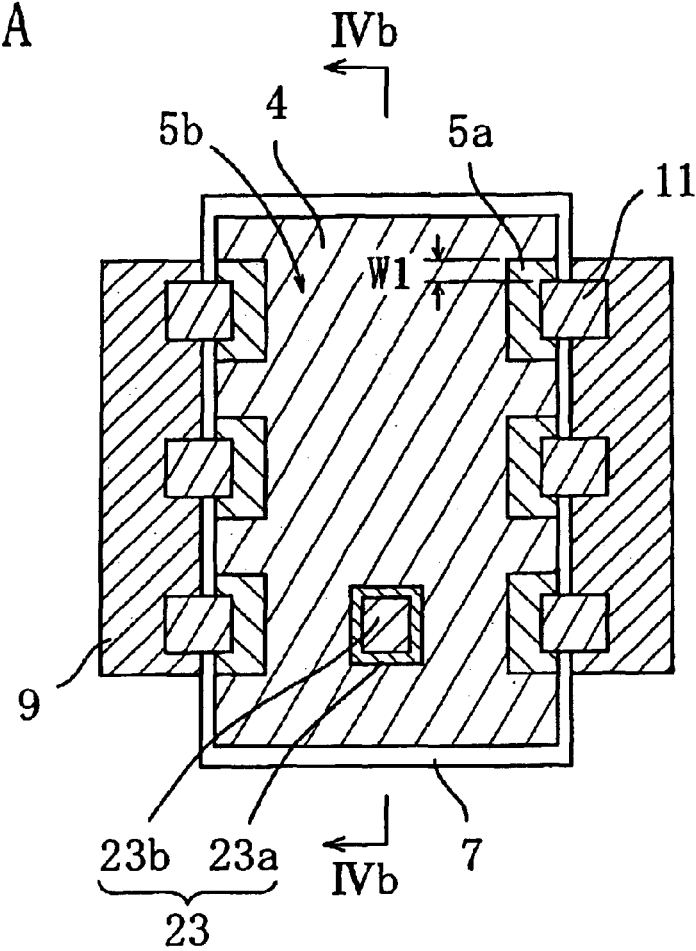
FIGS. 4A and 4B are a traverse cross-sectional view taken along line IVa—IVa in FIG. 4B and a vertical cross-sectional view taken along line IVb—IVb in FIG. 4A, respectively, illustrating the cross-sectional structure of the p-channel MISFET at the stage shown in FIG. 3C.
Figure 4B:
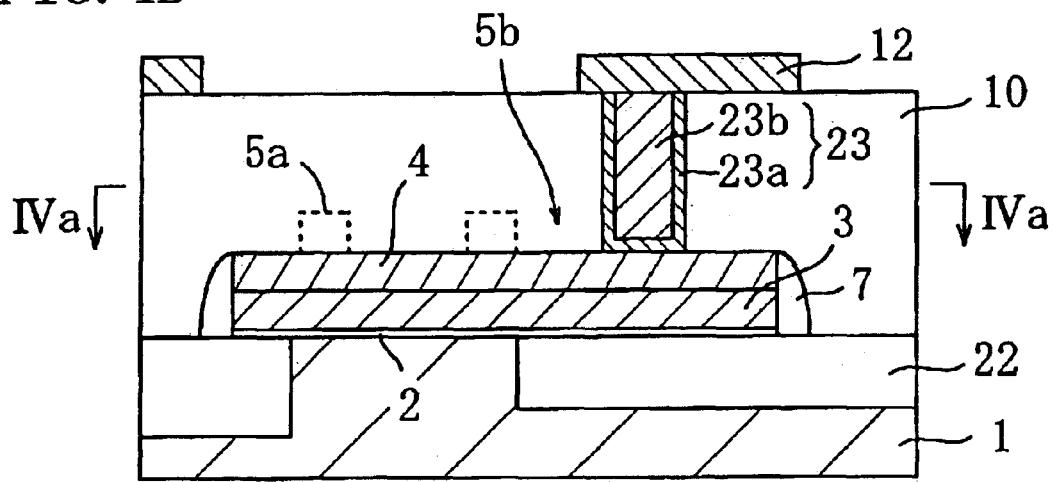

FIGS. 4A and 4B are a traverse cross-sectional view taken along line IVa—IVa in FIG. 4B and a vertical cross-sectional view taken along line IVb—IVb in FIG. 4A, respectively, illustrating the cross-sectional structure of the p-channel MISFET at the stage shown in FIG. 3C. In FIG. 4A, the interlayer insulating film is represented as a transparent member, and illustration of device isolation regions and the like is omitted. As shown in FIG. 4A, the gate-top protection film 5 has been removed except for the portions 5a having the possibility of overlapping the source/drain contacts 11. In other words, the gate-top protection film 5 shown in FIG. 3A has the opening 5b exposing at least part of a portion of the area located on the top surface of the upper gate electrode 4 other than the region in contact with the gate contact 23.

The process step serving as preparatory work for formation of SACs will be discussed in more detail. First, a photoresist film is formed on the interlayer insulating film 10 and patterned to form a resist mask having openings corresponding to the contact holes to be formed. Dry etching is then performed using the resist mask to form the contact holes reaching the cobalt silicide films 9 on the source/drain regions 8 through the interlayer insulating film 10. In this series of processing, a photomask called a reticle is used during the patterning of the photoresist film to form the resist mask. At this use of the photomask, alignment is required between the photomask for formation of the resist mask and the photomask used for the gate electrode formation. In this alignment, a margin of about ±0.02 μm, for example, is generally set in consideration that the relative positions of the finally formed source/drain contacts with respect to the gate electrode may be deviated from the designed positions due to an error in the process of photolithography and dry etching. However, to set the margin, a large area must be secured for the active region. As measures against this problem, in a semiconductor device adopting the SAC structure to attain scaledown, as in this embodiment, a gate-top protection film made of a silicon nitride film is formed on the gate electrode to prevent contact holes from being in contact with the top surface of the gate electrode even when the contact holes overlap the gate electrode, or nitride film sidewalls are provided in addition to the gate-top protection film. With this structure, formation of self-alignment contact holes is possible.

In this embodiment, therefore, the size and positions of the portions 5a as the remainders of the gate-top protection film 5 are set so that the source/drain contacts 11 are kept away from coming into contact with the upper gate electrode 4 beyond the portions 5a even if the positions of the source/drain contacts 11 vary due to an error in process. For example, assume that the positions of the source/drain contacts 11 shown in FIG. 4A are designed positions and the variation in the relative positions of the source/drain contacts 11 with respect to the gate electrode (upper gate electrode 4) is ±W0 (±0.02 μm, for example). In this case, a value W1 (±0.03 μm, for example) obtained by multiplying the variation W0 by a safety factor may be added to the designed positions of the source/drain contacts 11 (see FIG. 4A).

The positions and size of the portions 5a as the remainders of the gate-top protection film 5 are not limited to those described above, but vary depending on the type of process and the apparatus used for fabrication of the semiconductor device.

In the fabrication method of this embodiment, the back silicon nitride films 14 and 21 are not removed. However, in this embodiment, the annealing is performed after a majority of the gate-top protection film 5 has been removed leaving only the portions 5a required for SAC formation, in the process step shown in FIG. 3B. Therefore, application of stress to the Si substrate 1 can be suppressed, and also hydrogen in the lower gate electrode 3 can be efficiently diffused to the outside. Thus, in this embodiment, in particular, it is possible to suppress boron in the lower gate electrode 3 from diffusing into the gate insulating film 2 and the Si substrate 1 more effectively, compared with the above embodiments. As a result, decrease in hot carrier resistance during actual use of the semiconductor device can be suppressed, and the variation in threshold voltage due to reduction in flat band voltage can be effectively prevented. With the improvement of the hot carrier resistance during actual use of the semiconductor device, the gate insulating film 2 can be made thinner.

The back silicon nitride films 14 and 21 may be removed in a manner similar to that described in Embodiment 1 or 2.

Embodiment 4

Figure 5A:
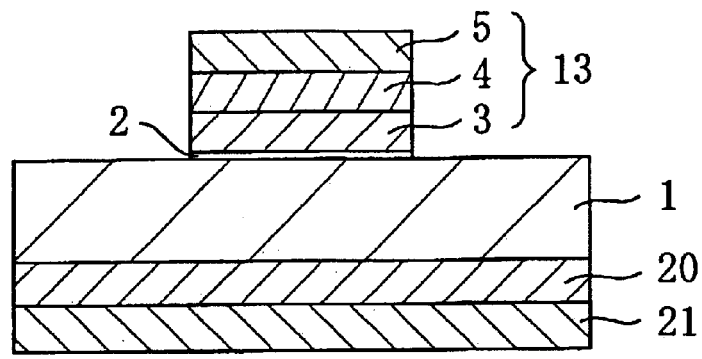
FIGS. 5A to 5C are cross-sectional views showing a fabrication process of a p-channel MISFET of the SAC structure in Embodiment 4 of the present invention.
Figure 5B:
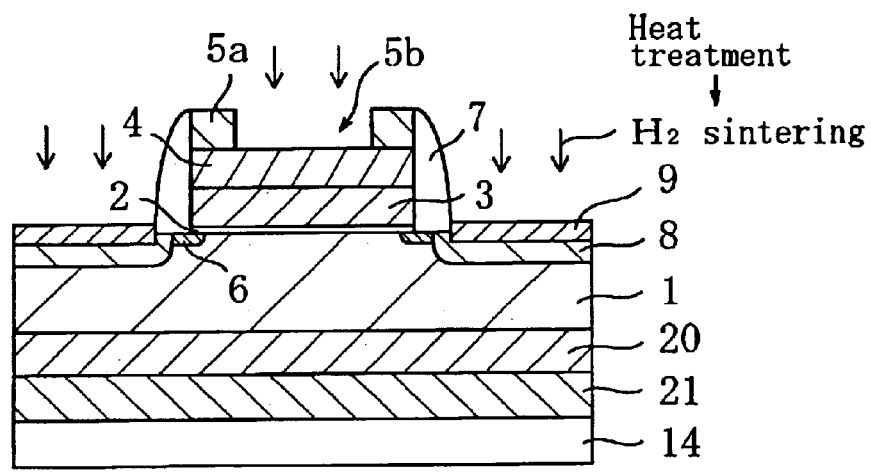
Figure 5C:
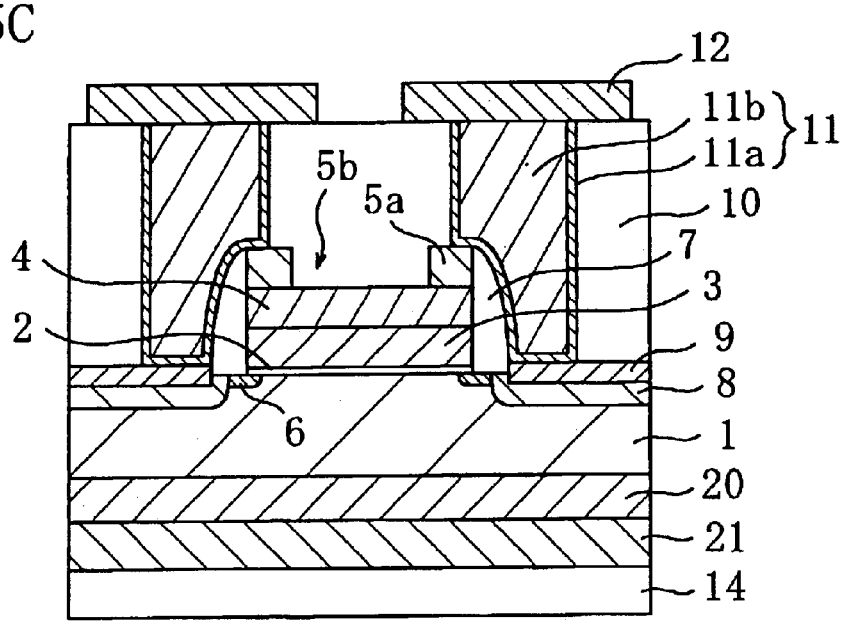

FIGS. 5A to 5C are cross-sectional views showing a fabrication process of a p-channel MISFET of the SAC structure in Embodiment 4 of the present invention. In general, an n-channel MISFET is also formed in another region although illustration of the fabrication process thereof is omitted in FIGS. 5A to 5C.

Referring to FIG. 5A, a silicon oxide-nitride film serving as a gate insulating film is formed on the principal plane of a Si substrate 1. A polysilicon film is then deposited on the silicon oxide-nitride film by LPCVD. During this deposition, the polysilicon film is also deposited on the back surface of the Si substrate 1 as a back polysilicon film 20. Boron ions ($B^+$) as p-type impurity ions are implanted in a portion of the polysilicon film on the principal plane side of the Si substrate 1 located in a p-channel MISFET formation region under the conditions of an accelerating energy of 5 keV and a dose of $3 \times 10^{15}$ cm$^{-2}$. Note that in general n-type impurity ions are implanted in an n-channel MISFET formation region. A metal film having a thickness of 50 nm is then deposited by sputtering, and thereafter a silicon nitride film having a thickness of 100 nm is deposited on the metal film. During this deposition, the silicon nitride film is also deposited on the surface of the back polysilicon film 20 on the back side of the Si substrate 1, as a back silicon nitride film 21. Thereafter, the silicon nitride film, the metal film, the polysilicon film and the silicon oxide-nitride film formed on the principal plane side of the Si substrate 1 are patterned by photolithography and dry etching, to form a gate electrode portion 13 essentially composed of a gate insulating film 2, a lower gate electrode 3, an upper gate electrode 4 and a gate-top protection film 5 layered on the Si substrate 1.

Referring to FIG. 5B, a resist mask is formed covering the n-channel MISFET formation region while leaving the p-channel MISFET formation region open. In this state, boron fluoride ions ($BF_2^+$) as p-type impurity ions are implanted in the Si substrate 1 using the gate electrode portion 13 as a mask under the conditions of an accelerating energy of 10 keV and a dose of $3.0 \times 10^{14}$ cm$^{-2}$, to form p-type LDD layers 6. After removal of the resist mask, a silicon nitride film is deposited on the resultant substrate to a thickness of 80 nm by LPCVD. The silicon nitride film is then etched back to form nitride film sidewalls 7 on the sides of the gate electrode portion 13. During this etch-back, a back silicon nitride film 14 formed during the deposition of the silicon nitride film for the sidewalls remains unremoved on the back silicon nitride film 21 on the back side of the Si substrate 1. Thereafter, a resist mask is formed covering the n-channel MISFET formation region while leaving the p-channel MISFET formation region open. In this state, boron fluoride ions ($BF_2^+$) as p-type impurity ions are implanted in the Si substrate 1 using the lower gate electrode 3 and the nitride film sidewalls 7 as a mask under the conditions of an accelerating energy of 50 keV and a dose of $5.0 \times 10^{15}$ cm$^{-2}$, to form p-type source/drain regions 8.

Thereafter, in the fabrication method of this embodiment, the gate-top protection film 5 is patterned by photolithography and dry-etching, leaving only portions 5a behind at positions presumed to overlap source/drain contacts to be formed at a later stage. The positions and size of the portions 5a are as discussed above in Embodiment 3 with reference to FIGS. 4A and 4B.

The impurities implanted in the LDD regions 6 and the source/drain regions 8 are activated by rapid thermal annealing (RTA) at 1000° C. for 10 seconds. Subsequently, a Co film having a thickness of 8 nm is deposited on the resultant substrate and subjected to thermal treatment at 500° C. for 60 seconds to allow Si to react with Co to form cobalt silicide films 9 on the source/drain regions 8. Unreacted part of the Co film is then removed by etching.

At the stage described above, heat treatment in a hydrogen atmosphere (hydrogen sintering) is performed at 400° C. for 30 minutes, for example, for recovery from a fixed level induced at the interface between the Si substrate 1 and the gate insulating film 2 and a damage layer in the Si substrate 1.

Referring to FIG. 5C, an interlayer insulating film 10 made of a BPSG film having a thickness of 800 nm is deposited on the resultant substrate and smoothed by CMP. Source/drain contact holes and a gate contact hole are then formed through the interlayer insulating film 10, to reach the source/drain regions 8 and the upper gate electrode 4, respectively, by dry etching using a resist mask. The contact holes are then filled with a Ti/TiN barrier metal film, a tungsten film and the like, to form source/drain contacts 11 each composed of a barrier layer 11a and a plug 11b and a gate contact (not shown) composed of a barrier layer and a plug. During this formation, no margin is set for alignment between the photomask used for the gate electrode patterning and the photomask used for the contact hole formation (self-alignment). Therefore, reduction in the size of the MISFET formation region is possible.

Thereafter, a metal film such as an aluminum alloy film is deposited on the interlayer insulating film 10 and then patterned to form metal interconnections 12 on the interlayer insulating film 10 to be connected with the source/drain contacts 11.

In the fabrication method of this embodiment, the annealing is performed after a majority of the gate-top protection film 5 has been removed leaving only the portions 5a required for SAC formation, in the process step shown in FIG. 5B. Therefore, application of stress to the Si substrate 1 can be suppressed, and also hydrogen in the lower gate electrode 3 can be efficiently diffused to the outside. Thus, substantially the same effect as that described in Embodiment 3 can be obtained.

In addition, in this embodiment, the hydrogen sintering is performed after a majority of the gate-top protection film 5 has been removed leaving only the portions 5a required for SAC formation, in the process step shown in FIG. 5B. Therefore, hydrogen can be effectively introduced into the gate insulating film 2 and the Si substrate 1. With this effective supply of hydrogen, recovery from a fixed level at the interface between the Si substrate 1 and the gate insulating film 2 and damage in the Si substrate 1 can be effectively performed. As a result, decrease in hot carrier resistance during actual use of the semiconductor device can be effectively suppressed.

The back silicon nitride films 14 and 21 may be removed in a manner similar to that described in Embodiment 1 or 2.

Embodiment 5

FIGS. 6A to 6D are cross-sectional views showing a fabrication process of a p-channel MISFET of the SAC structure in Embodiment 5 of the present invention. In this embodiment, the transistor is illustrated as is viewed from a cross section vertical to the channel direction. In general, an n-channel MISFET is also formed in another region although illustration of the fabrication process thereof is omitted in FIGS. 6A to 6D. Illustration of a back polysilicon film and a back silicon nitride film formed on the back side of the Si substrate is also omitted.

Referring to FIG. 6A, first, a device isolation insulating film 22 of a shallow trench structure is formed on the principal plane of a Si substrate 1, and a silicon oxide-nitride film serving as a gate insulating film is formed on an active region surrounded by the device isolation insulating film 22. A polysilicon film is then deposited on the silicon oxide-nitride film by LPCVD. Boron ions ($B^+$) as p-type impurity ions are implanted in a portion of the polysilicon film located in a p-channel MISFET formation region under the conditions of an accelerating energy of 5 keV and a dose of $3\times10^{15}$ $cm^{-2}$. Note that in general n-type impurity ions are implanted in an n-channel MISFET formation region. A metal film having a thickness of 50 nm is then deposited by sputtering, and subsequently a silicon nitride film having a thickness of 100 nm is deposited on the metal film. Thereafter, the silicon nitride film, the metal film, the polysilicon film and the silicon oxide-nitride film are patterned by photolithography and dry etching, to form a gate electrode portion 13 essentially composed of a gate insulating film 2, a lower gate electrode 3, an upper gate electrode 4 and a gate-top protection film 5 on the Si substrate 1.

Thereafter, although not shown in the cross section in FIG. 6A, p-type LDD layers 6 are formed as described in the above embodiments. That is, a resist mask is formed covering the n-channel MISFET formation region while leaving the p-channel MISFET formation region open. In this state, boron fluoride ions ($BF_2^+$) as p-type impurity ions are implanted in the Si substrate 1 under the conditions of an accelerating energy of 10 keV and a dose of $3.0\times10^{14}$ $cm^{-2}$. After removal of the resist mask, a silicon nitride film is deposited on the resultant substrate to a thickness of 80 nm by LPCVD. The silicon nitride film is then etched back to form nitride film sidewalls 7 on the sides of the gate electrode portion 13. Thereafter, although not shown in the cross section in FIG. 6A, p-type source/drain regions 8 are formed as described in the above embodiments. That is, a resist mask is formed covering the n-channel MISFET formation region while leaving the p-channel MISFET formation region open. In this state, boron fluoride ions ($BF_2^+$) as p-type impurity ions are implanted in the Si substrate 1 using the gate electrode portion 13 and the nitride film sidewalls 7 as a mask under the conditions of an accelerating energy of 50 keV and a dose of $5.0\times10^{15}$ $cm^{-2}$. Cobalt silicide films 9 are then formed on the source/drain regions 8 by depositing a Co film having a thickness of 8 nm on the resultant substrate and subjecting the Co film to thermal treatment at about 500° C. for 60 seconds to allow Si to react with Co. Unreacted part of the Co film is then removed by etching.

Referring to FIG. 6B, an interlayer insulating film 10 made of a BPSG film having a thickness of 800 nm is deposited on the resultant substrate and smoothed by CMP. A gate contact hole Hgc and a dummy contact hole Hdc are then formed through the interlayer insulating film 10 and the gate-top protection film 5 to reach the upper gate electrode 4 by dry etching using a resist mask. A barrier metal film 25 made of Ti/TiN is then formed over the gate contact hole Hgc, the dummy contact hole Hdc and the interlayer insulating film 10.

In the state described above, the impurities implanted in the LDD regions 6 and the source/drain regions 8 are activated by rapid thermal annealing (RTA) at 1000° C. for 10 seconds. Subsequently, heat treatment in a hydrogen atmosphere (hydrogen sintering) is performed at 400° C. for 30 minutes, for example, for recovery from a fixed level induced at the interface between the Si substrate 1 and the gate insulating film 2 and a damage layer in the Si substrate 1.

Referring to FIG. 6C, a tungsten film is deposited on the resultant substrate, which is then subjected to CMP. Thus, the gate contact hole Hgc and the dummy contact hole Hdc are filled with the Ti/TiN barrier metal film and the tungsten film, forming a gate contact 23 composed of a barrier layer 23a and a plug 23b and a dummy contact 24 composed of a barrier layer 24a and a plug 24b.

Referring to FIG. 6D, a metal film such as an aluminum alloy film is deposited on the interlayer insulating film 10 and then patterned to form a metal interconnection 12 on the interlayer insulating film 10 to be connected with the gate contact 23. No metal interconnection is connected with the dummy contact 24. That is, the dummy contact 24 is not used for application of a voltage to the gate electrode.

Figure 7:
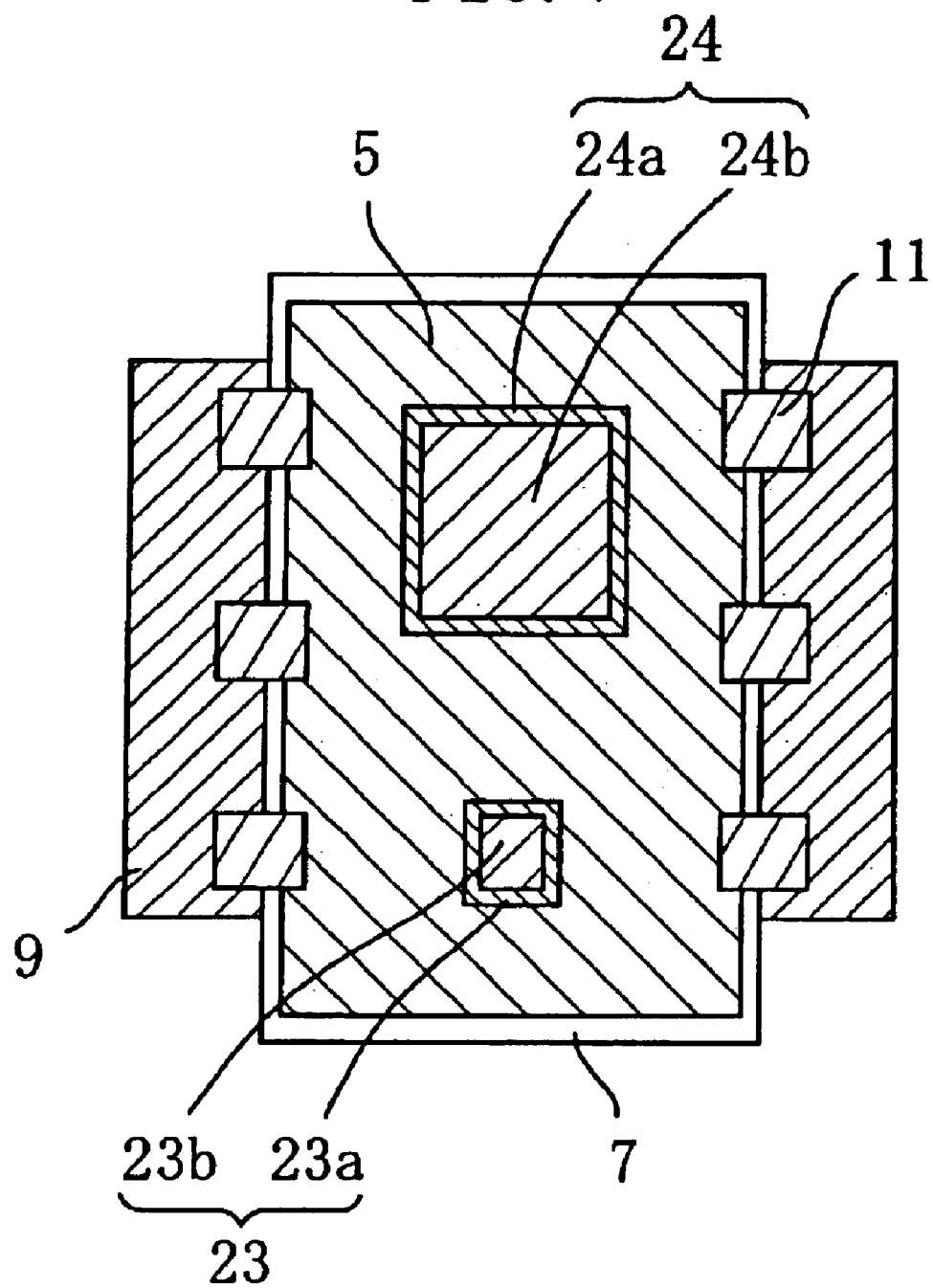
FIG. 7 is a traverse cross-sectional view taken along line VII—VII in FIG. 6D, illustrating the cross-sectional structure at the stage shown in FIG. 6D.

FIG. 7 is a traverse cross-sectional view taken along line VII—VII in FIG. 6D, illustrating the cross-sectional structure of the p-channel MISFET at the stage in FIG. 6D. In FIG. 7, the interlayer insulating film is represented as a transparent member, and illustration of device isolation regions and the like is omitted. As shown in FIG. 7, the regions of the gate-top protection film 5 that are in contact with the gate contact 23 and the dummy contact 24 have been removed. In other words, the gate-top protection film 5 has an opening exposing part of a portion of the area located on the top surface of the upper gate electrode 4 other than the region in contact with the gate contact 23 (that is, the region in contact with the dummy contact 24).

In this embodiment, no interconnection is provided for the dummy contact 24. Alternatively, a dummy interconnection electrically connected to nowhere may be formed for the dummy contact 24 simultaneously with the formation of the metal interconnection 12.

As shown in FIG. 6D, the gate contact is generally formed at a position above the device isolation insulating film 22, not above the active region. In general, this region has a divergent shape like a pad where the size in the channel direction is greater than the gate length. This is because the gate electrode is extremely narrowed above the active region (gate length: about 0.1 μm, for example). In the structure shown in FIG. 6D, since the dummy contact 24 is formed above the active region, it may protrude beyond the gate electrode. However, no problem will arise even when the dummy contact hole Hdc for formation of the dummy contact overlaps the nitride film sidewall 7 as long as it does not reach the source/drain region. Thus, the cross-sectional area of the dummy contact 24 can be easily made large sufficiently. For example, it can be made larger than that of the gate contact 23. Note however that the cross-sectional area of the dummy contact 24 is not necessarily larger than that of the gate contact 23. A plurality of dummy contacts may be provided for one gate electrode. Alternatively, the dummy contact may be provided on the portion of the gate electrode located above the device isolation insulating film 22.

In the fabrication method of this embodiment, heat treatment for activation of impurities is performed after the gate contact hole Hgc and the dummy contact hole Hdc reaching the upper gate electrode 4 have been formed through the interlayer insulating film 10 and the barrier metal film 25 made of Ti/TiN has been formed. Therefore, diffusion of impurities in the gate electrode to the outside can be facilitated, and also application of stress to the gate electrode during the heat treatment can be suppressed. Thus, it is possible to suppress intrusion of boron in the gate electrode into the gate insulating film 2 and the Si substrate 1 causing decrease in flat band voltage, and thus suppress the variation in threshold voltage due to the reduction in flat band voltage. Also, hydrogen sintering is performed at this stage. Therefore, hydrogen can be effectively introduced into the gate insulating film 2 and the Si substrate 1. With this effective supply of hydrogen, recovery from a fixed level at the interface between the Si substrate 1 and the gate insulating film 2 and damage in the Si substrate 1 can be effectively performed. As a result, decrease in hot carrier resistance during actual use of the semiconductor device can be effectively prevented, and thus a semiconductor device with high reliability is provided.

The fabrication method in Embodiment 4 requires both the photolithography and dry etching for patterning the gate electrode and the photolithography and dry etching for patterning the gate-top protection film to leave only the portions 5a behind. On the contrary, in this embodiment, the formation of the dummy contact hole Hdc can be executed simultaneously with the formation of the gate contact hold Hgc. Thus, a highly reliable semiconductor device can be fabricated without increasing the number of steps of photolithography and dry etching.

(Alterations to Embodiment 5)

In Embodiment 5, RTA and hydrogen sintering were performed after the deposition of the barrier metal film 25 and before the formation of the gate contact 23 and the dummy contact 24. If no impurities, or only a small amount of impurities, such as boron and phosphorus, are contained in the interlayer insulating film 10, RTA and hydrogen sintering can be performed immediately after the formation of the gate contact hole Hgc and the dummy contact hole Hdc.

Alternatively, RTA and hydrogen sintering may be performed after the deposition of the tungsten film on the barrier metal film 25 made of Ti/TiN to form the gate contact 23 and the dummy contact 24. In this case, also, the same effect can be obtained.

While the present invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A method for fabricating a semiconductor device, comprising the steps of:
   (a) forming a gate insulating film on a semiconductor substrate;
   (b) depositing a conductive film on the gate insulating film;
   (c) forming a silicon nitride film covering both surfaces of the semiconductor substrate after step (b);
   (d) patterning the conductive film and a portion of the silicon nitride film located on the principal plane side of the semiconductor substrate to form a gate electrode and a gate-top protection film;
   (e) implanting impurity ions in the semiconductor substrate to form source/drain regions after the step (d);
   (f) performing annealing for activation of the impurities implanted in the source/drain regions; and
   (g) removing a portion of the silicon nitride film located on the back side of the semiconductor substrate after step (c) and before step (f).

2. The method of claim 1, further comprising the step of performing hydrogen sintering after step (f).

3. A method for fabricating a semiconductor device, comprising the steps of:
   (a) forming a gate insulating film on a semiconductor substrate;
   (b) depositing a conductive film on the gate insulating film;
   (c) forming a silicon nitride film covering the principal plane of the semiconductor substrate after step (b);
   (d) patterning the silicon nitride film and the conductive film to form a gate-top protection film and a gate electrode;
   (e) implanting impurity ions in the semiconductor substrate to form source/drain regions after step (d);
   (f) forming an opening on the gate-top protection film by exposing a region in contact with the sate contact and a part of a region other than the region in contact with the gate contact, in an area located on the toy surface of the gate electrode, after step (e);
   (g) performing annealing for activation of the impurities implanted in the source/drain regions after step (f);
   (h) forming an interlayer insulating film on the resultant substrate after step (g); and
   (i) forming source/drain contact holes through the interlayer insulating film to reach the source/drain regions, the source/drain contact holes overlapping a part of the top surface of the gate electrode,
   wherein in step (f), portions are retained at least in a region where the source/drain contact holes overlap the gate electrode in the gate-top protection film.

4. The method of claim 3, further comprising the step of performing hydrogen sintering after step (g) and before the step (h).

5. A method for fabricating a semiconductor device, comprising the steps of:
   (a) forming a gate insulating film on a semiconductor substrate;
   (b) depositing a conductive film on the gate insulating film;
   (c) forming a silicon nitride film covering the principal plane of the semiconductor substrate after step (b);
   (d) patterning the silicon nitride film and the conductive film to form a gate-top protection film and a gate electrode;
   (e) implanting impurity ions in the semiconductor substrate to form source/drain regions after step (d);
   (f) forming an interlayer insulating film on the resultant substrate after step (e);
   (g) forming a contact hole through the interlayer insulating film and the gate-top protection film to reach the gate electrode; and
   (h) performing heat treatment for activation of the impurities implanted in the source/drain regions after step (g);
   wherein in the step (g), at least a gate contact hole and a dummy contact hole are formed as the contact hole, the gate contact hole is a hole to be filled with a contact member used for supply of a voltage to the gate electrode, and the dummy contact hole is a hole to be filled with a dummy contact member that is not used for supply of a voltage to the gate electrode.

6. The method of claim 5, further comprising the step of performing hydrogen sintering after step (g).

7. The method of claim 5, further comprising the step of forming a barrier metal film over the contact hole and the interlayer insulating film, wherein step (h) is performed after the step of forming a barrier metal film.

8. The method of claim 5, further comprising the step of forming a contact member by filling the contact hole with a conductive material, wherein step (h) is performed after the step of forming a contact member.

9. The method of claim 7, further comprising the step of performing hydrogen sintering after the step of forming a barrier metal film.

10. The method of claim 8, further comprising the step of performing hydrogen sintering after the step of forming a contact member.

11. A method for fabricating a semiconductor device, comprising:

(a) forming a gate insulating film on a semiconductor substrate;

(b) forming a gate electrode on the gate insulating film;

(c) forming a silicon nitride film covering a principal plane side and a back side of the semiconductor substrate after step (b);

(d) implanting impurity ions in the semiconductor substrate to form source/drain regions after step (c);

(e) performing annealing for activation of the impurities implanted in the source/drain regions; and (f) removing a first silicon nitride film located on the back side of the semiconductor substrate in the silicon nitride film after step (c) and before the step (e).

12. The method of claim 11, wherein in step (f), a masking film is formed on a second silicon nitride film located on the principal plane side of the semiconductor substrate in the silicon nitride film, and than the first silicon nitride film is removed by using the masking film as a mask.

13. The method of claim 12, wherein the masking film is a silicon oxide film.

14. The method of claim 11, further comprising:

etching back the second silicon nitride film located on the principal plane side of the semiconductor substrate in the silicon nitride film so as to form sidewalls on the sides of the gate electrode after step (c) and before step (d).

15. The method of claim 11, wherein in step (f), the first silicon nitride film is removed by wet etching.

16. The method of claim 11, wherein in step (a), the annealing is rapid thermal annealing.

17. The method of claim 11, further comprising: performing hydrogen sintering after step (e).

18. The method of claim 11, further comprising: forming a silicide film on the source/drain regions after step (e).

* * * * *

UNITED STATES PATENT AND TRADEMARK OFFICE
CERTIFICATE OF CORRECTION

PATENT NO. : 6,806,178 B2
DATED : October 19, 2004
INVENTOR(S) : Mizuki Segawa

It is certified that error appears in the above-identified patent and that said Letters Patent is hereby corrected as shown below:

<u>Column 18,</u>
Line 2, "after the steop (d)" should read -- after step (d) --
Line 24, "sate" should read -- gate --
Line 26, "toy" should read -- top --
Lines 40 - 41, "before the step (h)" should read -- before step (h) --

<u>Column 20,</u>
Line 11, "than" should read -- then --

Signed and Sealed this

Third Day of May, 2005

JON W. DUDAS
*Director of the United States Patent and Trademark Office*